United States Patent
Mosher et al.

(10) Patent No.: US 6,531,355 B2
(45) Date of Patent: Mar. 11, 2003

(54) LDMOS DEVICE WITH SELF-ALIGNED RESURF REGION AND METHOD OF FABRICATION

(75) Inventors: Dan M. Mosher, Plano, TX (US); Taylor R. Efland, Richardson, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/346,761

(22) Filed: Jul. 1, 1999

(65) Prior Publication Data

US 2001/0053581 A1 Dec. 20, 2001

Related U.S. Application Data

(62) Division of application No. 09/236,801, filed on Jan. 25, 1999.

(51) Int. Cl.[7] ................ H01L 21/8238; H01L 21/336
(52) U.S. Cl. .............. 438/227; 438/268; 438/286; 438/298
(58) Field of Search .................. 257/335, 336, 257/337, 338, 492, 493; 438/227, 298, 268, 286

(56) References Cited

U.S. PATENT DOCUMENTS

| | | | |
|---|---|---|---|
| 4,890,142 A | 12/1989 | Tonnel et al. | 357/23.4 |
| 4,961,101 A | 10/1990 | Yeh et al. | 357/49 |
| 4,990,982 A * | 2/1991 | Omoto et al. | |
| 5,055,896 A | 10/1991 | Williams et al. | 357/23.8 |
| 5,306,652 A * | 4/1994 | Kwon et al. | |
| 5,322,804 A * | 6/1994 | Beasom | |
| 5,346,835 A | 9/1994 | Malhi et al. | 437/41 |
| 5,406,110 A * | 4/1995 | Kwon et al. | |
| 5,422,508 A * | 6/1995 | Yilmaz et al. | |
| 5,428,241 A | 6/1995 | Terashima | 257/409 |
| 5,510,275 A * | 4/1996 | Malhi | |
| 5,510,643 A | 4/1996 | Kariyama | 257/409 |
| 5,578,514 A * | 11/1996 | Kwon et al. | |
| 5,585,660 A * | 12/1996 | Mei | |
| 5,627,394 A * | 5/1997 | Chang et al. | |
| 5,631,177 A * | 5/1997 | Zambrano | 438/138 |
| 5,728,594 A | 3/1998 | Efland et al. | 437/40 |
| 6,063,674 A * | 5/2000 | Yang et al. | |

FOREIGN PATENT DOCUMENTS

DE 0676799 A2 * 11/1995

OTHER PUBLICATIONS

Tsai et al, "16–60V rated LDMOS show advanced performance in a 0.72 micron evolution BiMOS power technology," IEEE IEDM pp. 367–370 (1997).*

Efland, et al., "Self–Aligned RESURF To LOCOS Region LDMOS Characterization shows Excellent $R_{sp}$ vs BV Performance", IEEE 1996 May 20, 1996, pp. 147–150, XP 000598417.

Efland, et al., "An Optimized RESURF LDMOS Power Device Module Compatible with Advanced Logic Processes", 1992 IEEE IEDM 92/237–92/240.

* cited by examiner

Primary Examiner—John F. Niebling
Assistant Examiner—Ron Pompey
(74) Attorney, Agent, or Firm—Jacqueline J. Garner; W. James Brady, III; Frederick J. Telecky, Jr.

(57) ABSTRACT

A RESURF LDMOS transistor (64) includes a RESURF region (42) that is self-aligned to a LOCOS field oxide region (44). The self-alignment produces a stable breakdown voltage BVdss by eliminating degradation associated with geometric misalignment and process tolerance variation.

2 Claims, 5 Drawing Sheets

LDMOS DEVICE WITH SELF-ALIGNED RESURF REGION AND METHOD OF FABRICATION

This is a divisional application Ser. No. 09/236,801, filed Jan. 25, 1999 which is a divisional application of Ser. No. 08/856,498 filed May 14, 1997 which is a non-provisional application of provisional application No. B 60/017,714filed May 15, 1996.

FIELD OF THE INVENTION

This invention relates to semiconductor devices and, more particularly, to an LDMOS (lateral double-diffused "metal"-oxide-semiconductor) device having a self-aligned RESURF (REduced SURface Field) region and method of fabrication thereof.

BACKGROUND OF THE INVENTION

LDMOS (lateral double-diffused MOS) devices are quickly replacing bipolar devices as power devices in intelligent power integrated circuits due to their performance advantage. The proliferation of increasingly diversified applications for power integrated circuits has led to a desire for components having a wide variety of breakdown voltages (BVdss).

RESURF (REduced SURface Field) LDMOS transistors have been developed in which a RESURF diffusion is placed in the drift region of the device to maximize breakdown voltage (BVdss) for a given specific-on-resistance (Rsp= Rdson*Area, where Rdson=drain to source resistance with the transistor on). While presently available RESURF LDMOS devices exhibit high breakdown voltages and low specific-on-resistance, considerable variation in breakdown voltage is exhibited among devices fabricated by the same process on different wafers or in different lots. This wide variation in breakdown voltage is unacceptable in the many applications that can tolerate only a narrow range of breakdown voltages. This causes low yields and high costs.

Accordingly, a need exists for a RESURF LDMOS device having a stable, predictable breakdown voltage.

SUMMARY OF THE INVENTION

Applicants have discovered that variations in 1.) alignment tolerance for the RESURF region overlap of the LOCOS region (where overlap=lateral spacing between the edge of LOCOS field oxide region adjacent to the thin gate oxide and the edge of RESURF region), and 2.) alignment tolerance between the RESURF region and DWELL region, contribute to the unacceptable variation in breakdown voltages in presently available RESURF LDMOS transistors. In addition, applicants have discovered that variations in RESURF implant dose tolerance causes premature breakdown problem on the drain N+ contact side of the device.

Generally, and in one form of the invention, a transistor includes:

a semiconductor layer of a first conductivity type;

a RESURF region of a second conductivity type formed in the semiconductor layer;

a LOCOS field oxide region formed at a face of the RESURF region, the RESURF region being self-aligned to the LOCOS field oxide region;

a well of the first conductivity type formed in the semiconductor layer;

a source region of the second conductivity type formed in the well, a channel region defined in the well between a first edge of the source region and a first edge of the RESURF region;

a drain region of the second conductivity type formed in the semiconductor layer adjacent a second edge of the RESURF region; and a conductive gate formed over and insulated from the channel region.

In another aspect of the invention, a method of manufacturing a transistor includes the steps of:

forming a semiconductor layer of a first conductivity type;

forming a mask over the semiconductor layer, the mask having an opening exposing a first region of the semiconductor layer;

implanting a dopant of a second conductivity type through the opening in the mask in the first region of the semiconductor layer to form a RESURF region;

growing a LOCOS field oxide region at a face of the first region defined by the opening of the mask, the RESURF region being self-aligned with the LOCOS field oxide region;

forming a conductive gate over and insulated from a face of the semiconductor layer, the conductive gate extending over a portion of the LOCOS field oxide region;

forming a well of the first conductivity type in the semiconductor layer adjacent the RESURF region;

forming a source region of the second conductivity type in the well, the conductive gate extending over a channel region defined in the well between a first edge of the source region and a first edge of the RESURF region; and forming a drain region of the second conductivity type in the semiconductor layer adjacent a second edge of the RESURF region.

It is an advantage of the invention that the RESURF region is self-aligned to the LOCOS field oxide region. This feature produces a stable breakdown voltage, BVdss, thus enhancing device performance, by eliminating degradation associated with geometric misalignment and process tolerance variation. Further, the RESURF LDMOS transistor of the present invention is fabricated using standard P well and standard source/drain diffusions formed in a P epitaxial layer on a P substrate and is therefore compatible with conventional linear BiCMOS processes and may be formed on an integrated circuit having a wide variety of other linear BiCMOS process compatible devices.

BRIEF DESCRIPTION OF THE DRAWINGS

In the drawings.

Corresponding numerals and symbols in the different figures refer to corresponding parts unless otherwise indicated.

DETAILED DESCRIPTION OF THE PREFERRED EMBODIMENTS

Figure 1:
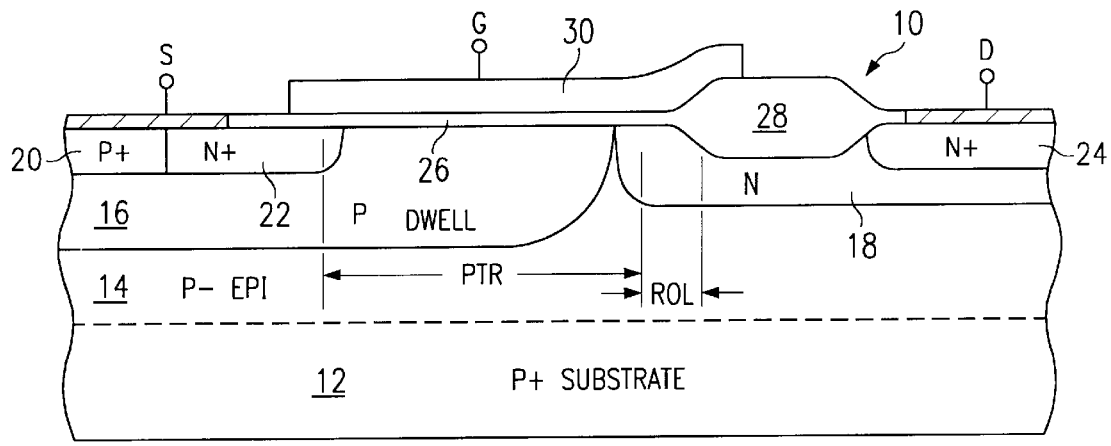
FIG. 1 is a cross-sectional elevation view of a RESURF LDMOS transistor according to the prior art.

FIG. 1 shows a RESURF LDMOS transistor 10 according to the prior art. Transistor 10 is fabricated in a P– epitaxial layer 14 formed over P+ substrate 12. Transistor 10 is formed by implanting an N– RESURF region 18 in epitaxial layer 14. A layer of nitride is then deposited and patterned to expose the area in RESURF region 18 in which LOCOS field oxide region 28 will be grown. LOCOS field oxide region 28 is then grown. A gate oxide layer 26 is then formed on the surface and a layer of polysilicon is deposited and patterned to form gate 30. P DWELL region 16 is then implanted in epitaxial layer 14 using an edge of gate 30 as a mask. A layer of photoresist is patterned to define a P+ backgate contact mask and P+ backgate contact 20 is implanted. Another layer of photoresist is then patterned to define an N+ source/drain mask and N+ source region 22 and N+ drain region 24 are implanted.

A drawback to the process for manufacturing RESURF LDMOS transistor 10 is the fact that it results in an unacceptable variation in breakdown voltages. Transistors manufactured with the above-described process exhibit breakdown voltages that extend over a range which is unacceptably large for many power applications.

Applicants have discovered that variations in 1.) alignment tolerance for the RESURF region 18 overlap of the LOCOS region 28 (where overlap (ROL in FIG. 1)=lateral distance between the edge of LOCOS field oxide region 28 and the edge of RESURF region 18 adjacent to the thin gate oxide region, and 2.) alignment tolerance of the spacing between the RESURF region 18 and DWELL region 16 (where spacing (PTR in FIG. 1)=lateral distance between the edge of the source region 22 and the edge of RESURF region 18, contribute to the unacceptable variation in breakdown voltages in RESURF LDMOS transistor 10. These variations in alignment tolerances are due to the fact that RESURF region 18 is not self-aligned with LOCOS region 24. In addition, applicants have discovered that variation in the tolerance of RESURF implant dose creates a low breakdown voltage in the drain region for increased dose.

FIGS. 2–6 are cross-sectional elevation views showing a RESURF LDMOS transistor according to the present invention in which the RESURF region is self-aligned to the LOCOS field oxide region at successive stages during fabrication.

Figure 2:
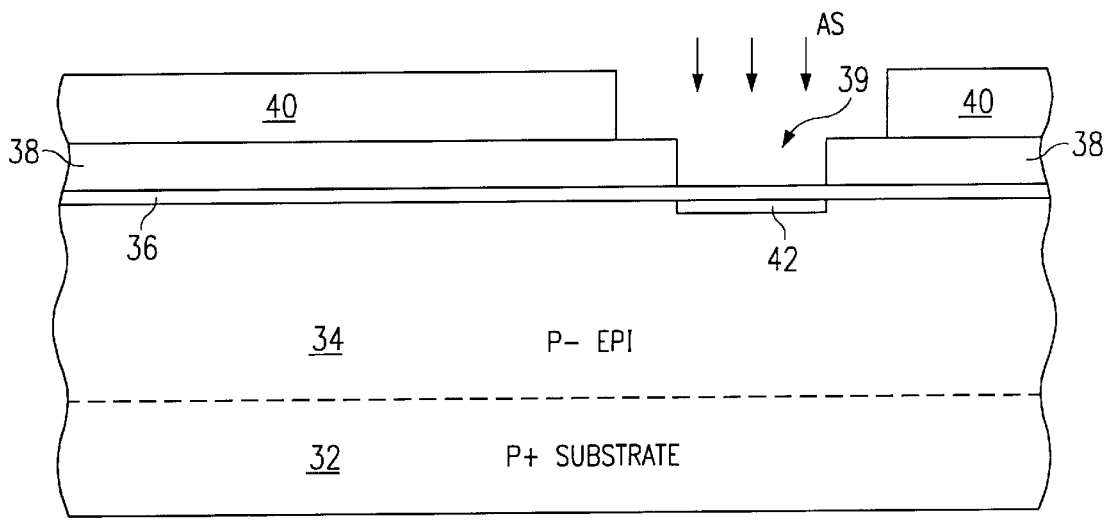
FIGS. 2–6 are cross-sectional elevation views showing a RESURF LDMOS transistor according to the present invention at successive stages during fabrication.
Figure 3:
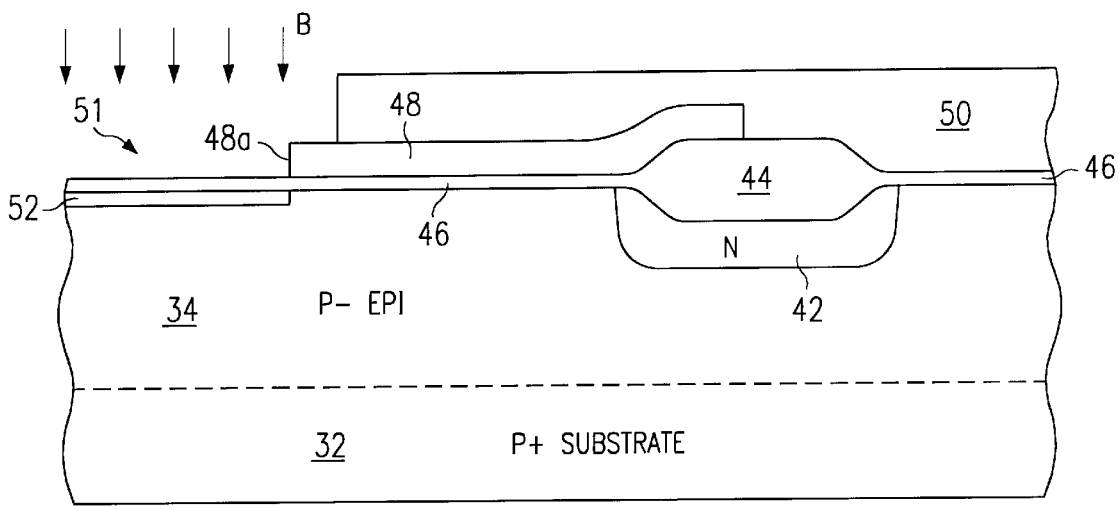
Figure 4:
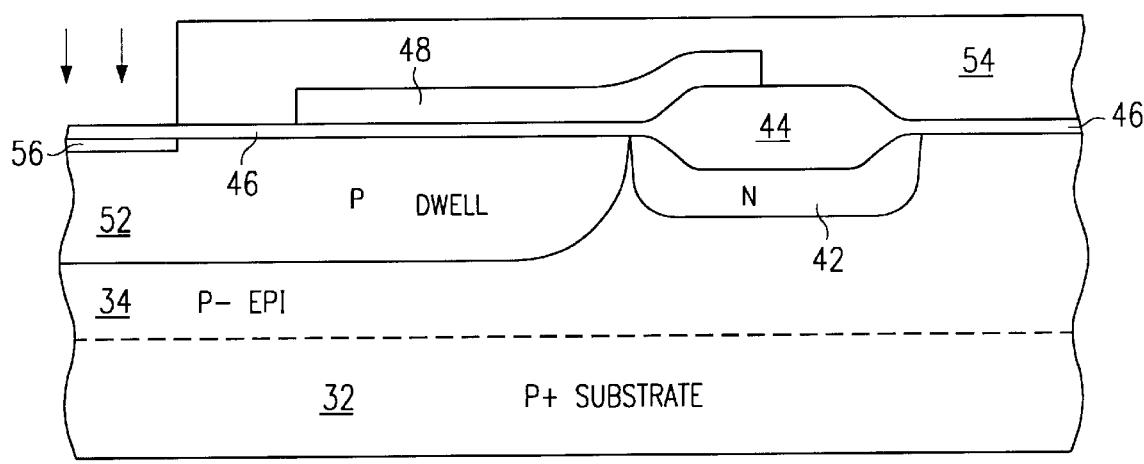
Figure 5:
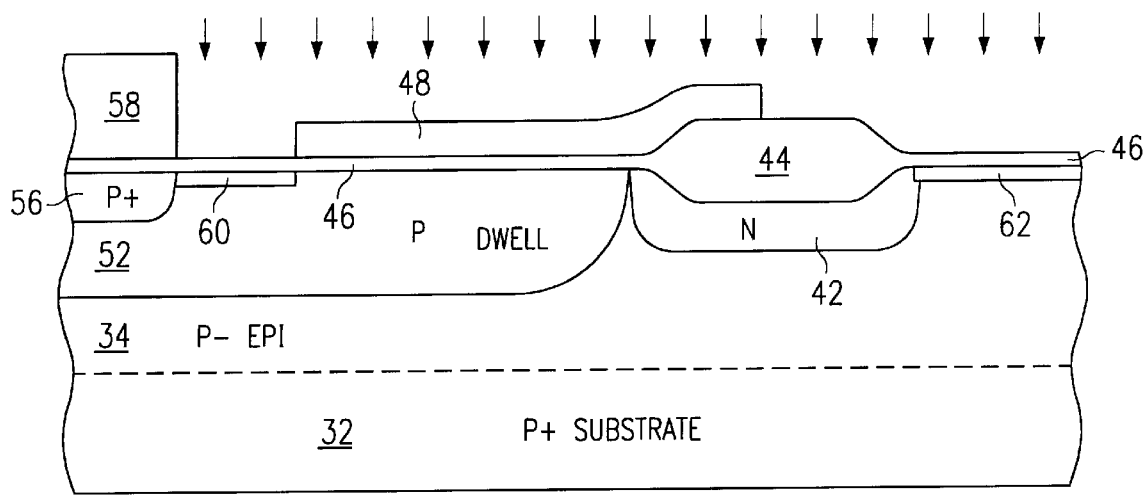

Referring to FIG. 2, fabrication of LDMOS transistor 31 initially begins with the formation of p– epitaxial layer 34 on p+ substrate 32. A pad oxide layer 36 is then formed over p– epitaxial layer 34. A nitride layer 38 is formed over pad oxide layer 36 and patterned and etched to expose areas, such as area 39, at which LOCOS field oxide will be grown.

A layer of photoresist 40 is then formed over nitride layer 38 and patterned to expose only those areas, such as area 39, in which RESURF regions will be implanted in epitaxial layer 14 prior to growing LOCOS field oxide. Areas exposed by patterned nitride layer 38 at which LOCOS field oxide will subsequently be grown but in which RESURF regions are not to be implanted are blocked by photoresist mask 40.

An n type dopant, such as arsenic with a dose of about $7\times10^{12}$ atoms/cm$^2$ at an energy of about 135 KeV, is then implanted through the openings in photoresist layer 40 and nitride layer 38 into area 39 of p– epitaxial layer 14 to form RESURF region 42, resulting in the structure shown in FIG. 2. The arsenic is preferred since it diffuses slowly and allows a shallow junction preferred for the RESURF region after thermal cycling.

Thermal cycling is then performed to anneal and partially diffuse RESURF region 42 while growing LOCOS field oxide region 44 to a thickness of about 5500 Angstroms. Since RESURF region 42 and LOCOS field oxide region 44 are formed using the same patterned nitride layer 38, RESURF region 42 is self-aligned to LOCOS field oxide region 44. The pad oxide layer 36 and nitride layer 38 are then removed, using a plasma etch, for example. A gate oxide layer 46 is then thermally grown over the surface of epitaxial layer 34 on either side of LOCOS field oxide region 44 to a thickness of about 500 Angstroms for a 60V device. Other thicknesses of gate oxide layer 46 could be used when fabricating devices having different voltage ratings.

A polysilicon layer with a thickness of about 4500 Angstroms is then deposited over gate oxide layer 46 and field oxide region 44 and doped with an impurity, such as phosphorus, to render it conductive. A layer of photoresist (not shown) is deposited over the polysilicon layer and developed to define a gate mask. The polysilicon layer is then etched using the photoresist gate mask to form gate 48. Gate 48 extends up onto field region 44 and functions as a field plate by pulling back the depletion into the RESURF region under reverse bias operation. This allows for higher reverse bias with a shorter channel region without premature punch-through. The photoresist gate mask is then removed.

A layer of photoresist 50 is then deposited and developed so as to be recessed laterally from an edge 48a of gate 48 to define an opening 51 for a DWELL implant. The DWELL implant will be self-aligned with edge 48a of gate 48 while photoresist 50 will block the DWELL implant from the remainder of epitaxial layer 34. A p type dopant, such as boron with a dose of about $4\times10^{13}$ atoms/cm$^2$ at an energy of about 40 KeV, is then implanted through opening 51 to form DWELL region 52, resulting in the structure shown in FIG. 3.

Photoresist layer 50 is then removed and DWELL region 52 is annealed. A photoresist pattern 54 is formed over the device. An implant of a p type impurity, such as boron with a dose of about $4\times10^{15}$ atoms/cm$^2$ at an energy of about 40 KeV is then performed to form P+ backgate contact region 56 resulting in the structure shown in FIG. 4.

Photoresist layer 54 is then removed and P+ backgate contact region 56 annealed. A layer of photoresist 58 is then formed over the device and developed to block region 56. An N type implant, for example phosphorous with a dose of about $2\times10^{14}$ atoms/cm$^2$ at an energy of about 70 KeV, is then performed to form N+ source region 60 and N+ drain region 62 resulting in the structure shown in FIG. 5.

Figure 6:
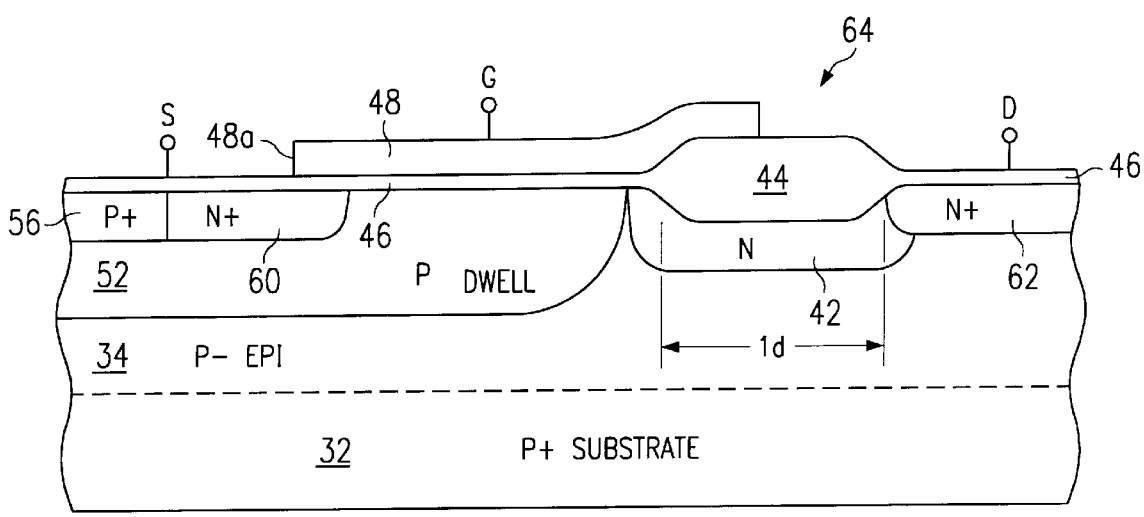

Photoresist layer 58 is then removed and source and drain regions 60 and 62 are annealed and diffused resulting in transistor 64 shown in FIG. 6. Metal contacts (not shown) are formed using conventional techniques to contact P+ backgate region 52, N+ source region 60, and N+ drain region 62. P+ backgate contact region 56 and N+ source region 60 may be tied together by a single metal contact (not shown) in typical power IC applications.

Transistor 64 is a RESURF LDMOS device having a RESURF region 42 which is self-aligned with LOCOS field oxide region 44. Since a single nitride opening determines where the RESURF implant is performed and where LOCOS field oxide region 44 will grow, RESURF region 42 is self-aligned to LOCOS field oxide region 44. Further since drain region 62 is self-aligned with LOCOS field oxide region 44, RESURF region 42 is also self-aligned with drain region 62. This self-alignment is advantageous because Rsp and BVdss are very dependent upon the position of the RESURF region relative to the drain, source and LOCOS field oxide regions.

Table 1 shows the results of a modeling study comparing device performance with four fabrication variables for the RESURF LDMOS device of FIG. 1 in which the RESURF region is non-self-aligned (nSAR) with the LOCOS field oxide and the RESURF LDMOS device of the present invention in which the RESURF region is self-aligned (SAR) with the LOCOS field oxide. Variations in BVdss and Rsp are shown for nominal values of each variable as well for standard tolerances above and below nominal.

Figure 7:
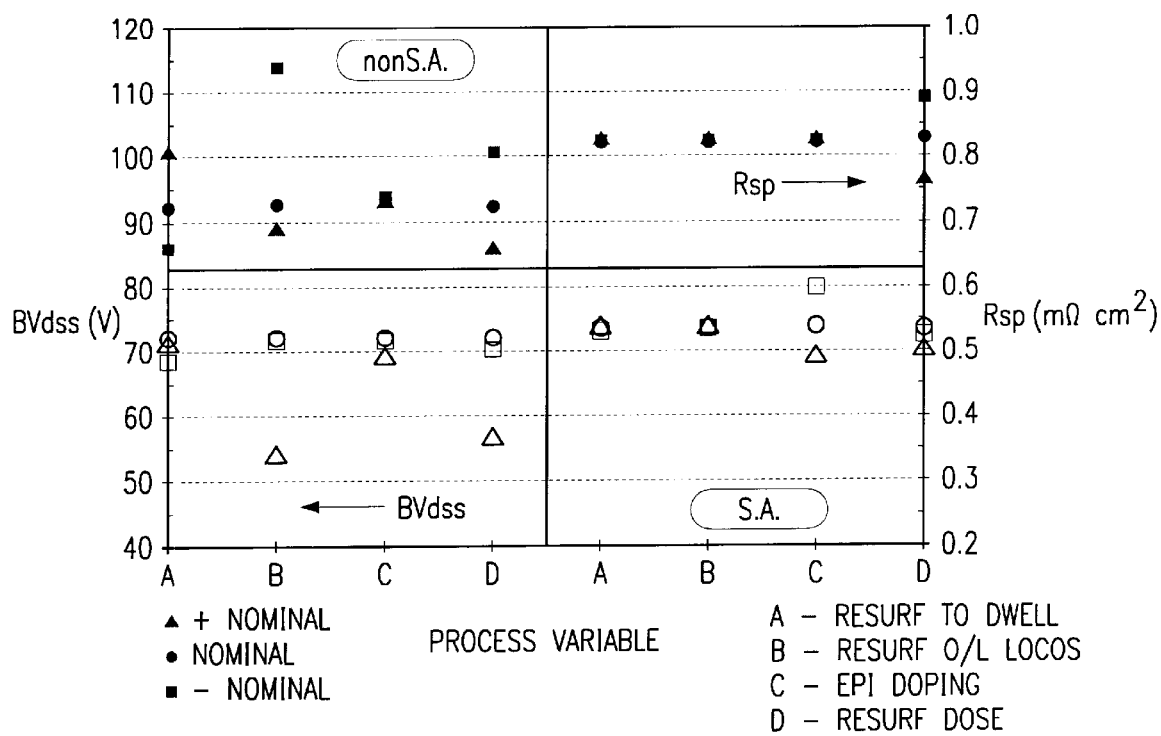
FIG. 7 is a chart comparing modeled performance versus process variation for RESURF LDMOS transistors of the type in FIG. 1 and RESURF LDMOS transistors according to the present invention.

FIG. 7 shows the modeling data of Table 1 in a quadrant chart, with BVdss and Rsp on the left and right ordinates, respectively. The left plane shows non-self-aligned (nSAR) data while the right plane shows self-aligned (SAR) data. Bvdss and Rsp performance are shown in the bottom and top planes, respectively. The fabrication variables are symbolized with letters on the abscissa. The letters for fabrication variables correspond to the letters in Table 1.

As seen in the left plane of FIG. 7, the variation in BVdss for RESURF LDMOS device of FIG. 1 in which the RESURF region is non-self-aligned (nSAR) with the LOCOS field oxide is significant for standard tolerances of variables B (RESURF overlap of LOCOS) and C (p-epi concentration). This significant variation in BVdss is unacceptable for the many applications which require a specific voltage rating. The shift of the RESURF region toward the p well as a result of positive alignment tolerance for the RESURF overlap of LOCOS field oxide (triangle for variable B) causes field intensification and results in premature breakdown. An increase in RESURF implant dose worsens the effect, making it difficult to reach the RESURF state. The apparent BVdss roll-off for increased RESURF dose is a result of high field build up and premature breakdown at the drain side of the drift region. Because of these two premature breakdown conditions, the epitaxy doping has very little effect on the BVdss.

As seen in Table 1 and the right plane of FIG. 7, the method for making the RESURF LDMOS device of the present invention, in which the RESURF region is self-aligned (SAR) with the LOCOS field oxide, reduces alignment tolerance A (P well to RESURF spacing) while eliminating alignment tolerance B (RESURF overlap of LOCOS field oxide). As a result, very stable BVdss is achieved at the cost of a marginal increase in Rsp. The BVdss variation for standard tolerances in variables A (P well to RESURF spacing), B (RESURF overlap of LOCOS), and D (RESURF implant dose) is almost zero with the triangle, circle, and square markers lying directly on top of one another. The reduction in variation associated with variable D (RESURF implant dose) occurs since the RESURF diffuses laterally in connection with the N+ drain region and does not surround as in the prior art RESURF LDMOS transistor of FIG. 1, thus creating a more stable condition. There is some slight variation in BVdss in the present invention with respect to variable C (epitaxial doping concentration) since the RESURF condition is being met and background concentration will affect the RESURF action.

Figure 8:
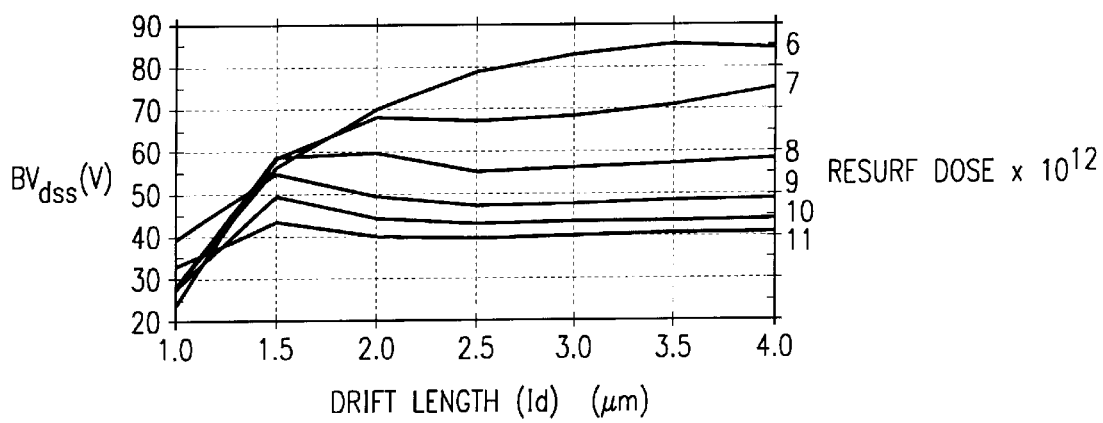
FIG. 8 is a graph of breakdown voltage (Bvdss) versus drift length (ld) for RESURF LDMOS transistors according to the present invention.

FIG. 8 is a graph illustrating how BVdss varies with changes in drift length (ld in FIG. 6) and RESURF dose for self-aligned RESURF LDMOS devices fabricated in accordance with the present invention. The data indicates that a dose of $7 \times 10^{12}/cm^2$ provides 68–69V plateau for a drift length between 2.0 and 2.5 microns.

Figure 9:
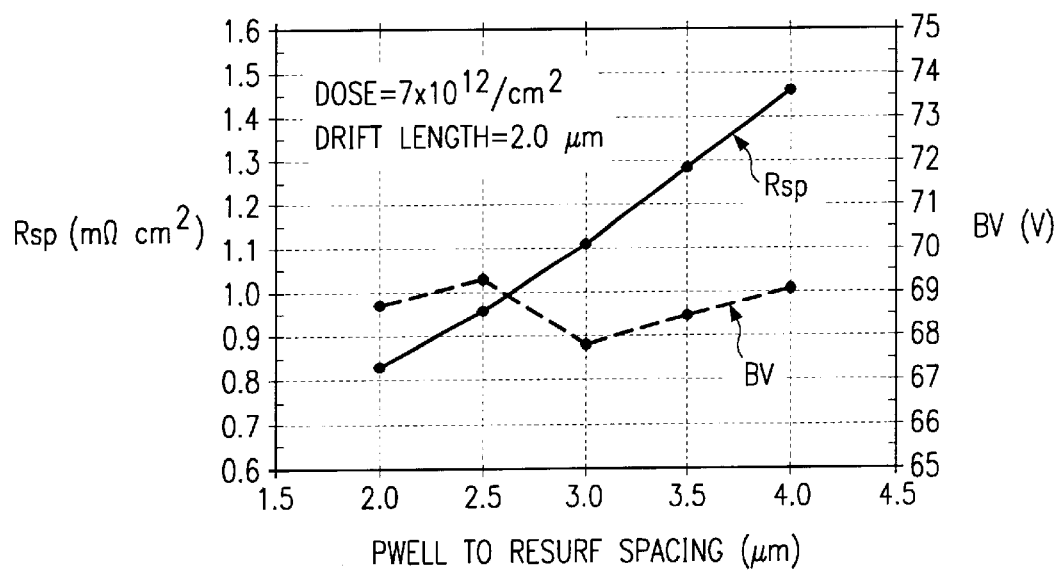
FIG. 9 is a graph of specific on-resistance (Rsp) and breakdown voltage (BV) versus Pwell to RESURF spacing for RESURF LDMOS transistors according to the present invention.

FIG. 9 is a graph showing Rsp and BVdss as a function of Pwell to RESURF region spacing for devices fabricated with a RESURF dose of $7 \times 10^{12}/cm^2$ and a drift length of 2.0 microns. As seen in FIG. 9, as the Pwell to RESURF spacing is reduced BVdss does not change much but Rsp is reduced due to reduced channel resistance and reduced cell pitch. BVdss is very stable versus Pwell to RESURF spacing because the gate acts as a field plate keeping the depletion pulled back from the channel region thus avoiding premature punch-through breakdown (this is illustrated by the two-dimensional modeling data plotted in FIG. 10). As illustrated by FIGS. 8 and 9, a drift length of 2.0 to 2.5 microns combined with a P well to RESURF region spacing of 2.0 microns could provide a BVdss in excess of 60V.

Figure 10:
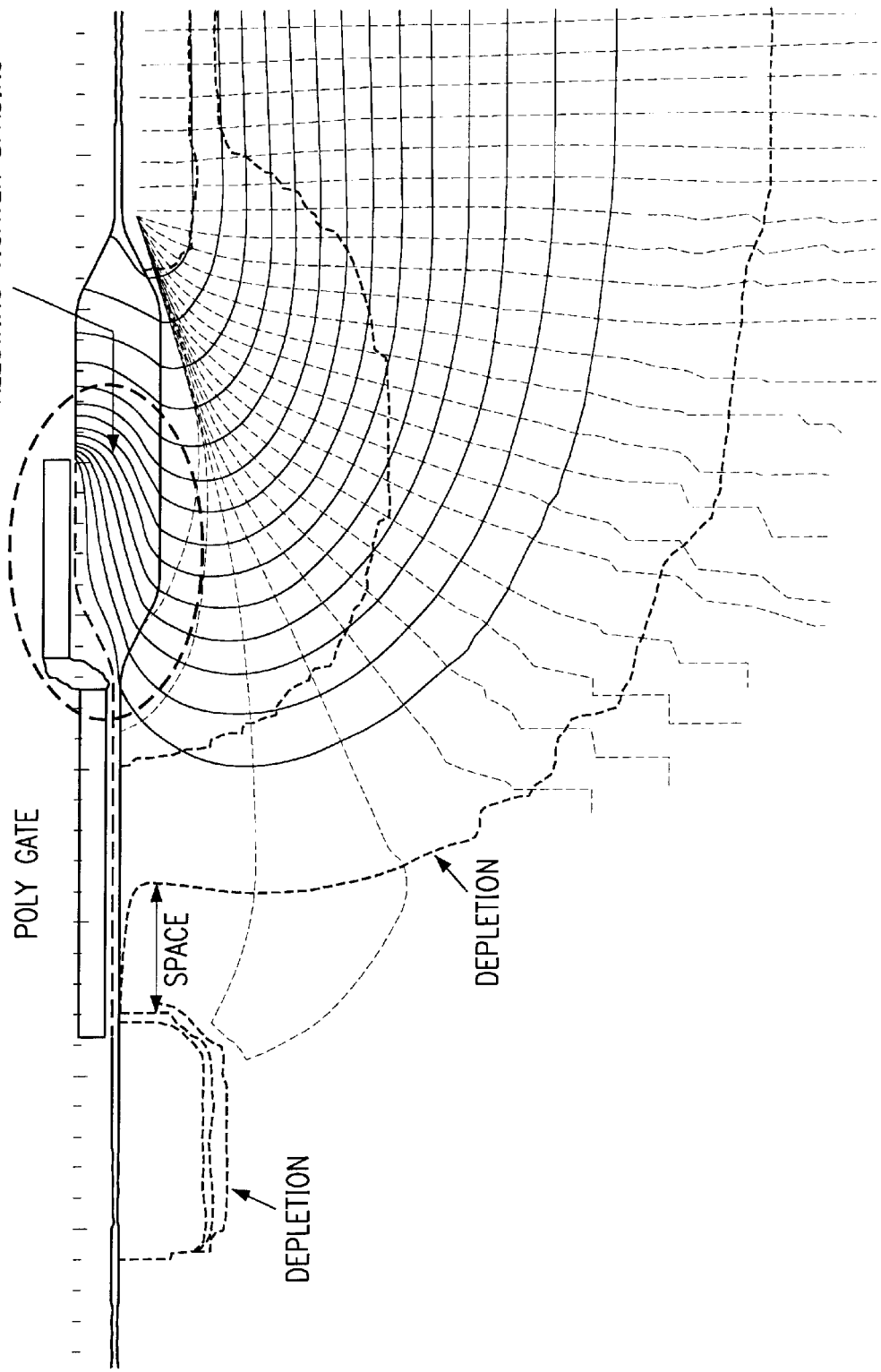
FIG. 10 is an equipotential plot for an optimized BVdss= 70V RESURF LDMOS transistor according to the present invention.

FIG. 10 is an equipotential distribution plot achieved using data from two-dimensional modeling of a device according to the present invention reversed biased at 70V. As seen in FIG. 10, the depletions do not touch. This is advantageous because it allows a reduced spacing and hence reduced channel length. A reduction in specific on resistance, in turn, results from the reduction in device pitch and device on resistance.

Figure 11:
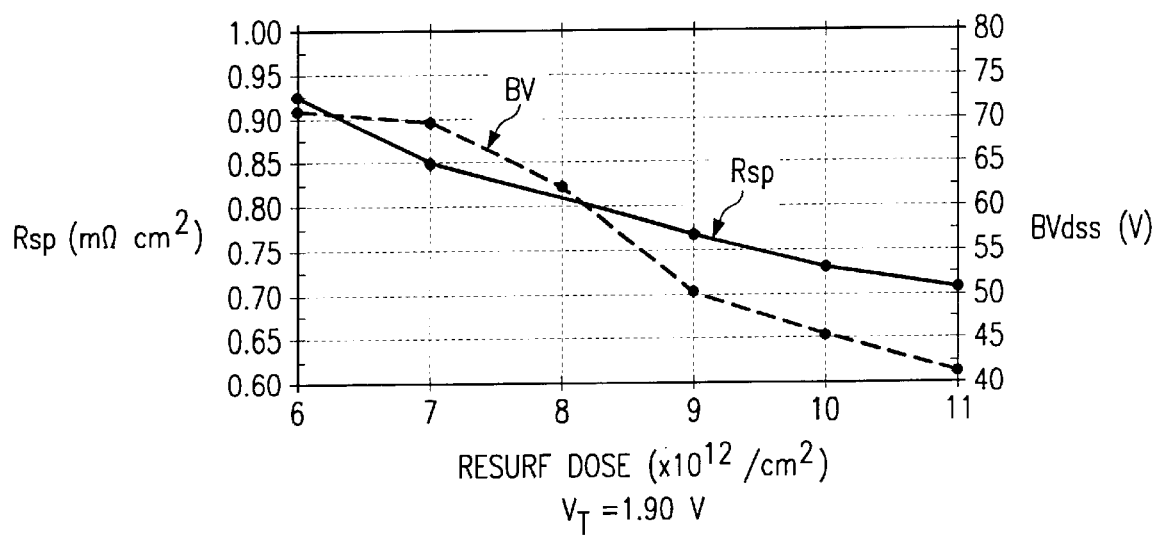
FIG. 11 is a graph of Rsp (at Vgs=15V) and BVdss versus RESURF dose for RESURF LDMOS transistors according to the present invention.

FIG. 11 is a graph showing Rsp at Vgs=15V and Bvdss as a function of RESURF dose for devices fabricated in accordance with the present invention. For a 60V rating, BVdss= 69V and Rsp=0.84 ohm.cm$^2$; this correlates closely with the modeled BV=73V and Rsp=0.82 ohm.cm$^2$ (Table 1).

It is an advantage of the invention that RESURF region 42 is self-aligned to LOCOS field oxide region 44. This feature produces a stable breakdown voltage BVdss, thus enhancing device performance, by eliminating degradation associated with geometric misalignment and process tolerance variation. Further, since RESURF LDMOS transistor 64 of the present invention is fabricated using a standard P well and standard source/drain diffusions formed in a P epitaxial layer on a P substrate, it is compatible with conventional linear BiCMOS processes and may be formed on an integrated circuit having a wide variety of other linear BiCMOS process compatible devices.

A preferred embodiment has been described in detail hereinabove. It is to be understood that the scope of the invention also comprehends embodiments different from that described, yet within the scope of the claims. For example, a RESURF LDMOS transistor 64 that is a PMOS transistor could be formed by changing regions of N type conductivity to P type and regions of P type to N type. In addition, instead of forming the RESURF LDMOS transistor directly in the epitaxial layer, it could be formed in a deep well in an epitaxial layer, the deep well being of the same conductivity type as the DWELL. The use of deep wells of opposite conductivity types would thus permit both PMOS and NMOS transistors to be formed on a single chip.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method of manufacturing a transistor, comprising the steps of:

forming a semiconductor layer of a first conductivity type;

forming a first mask over the semiconductor layer, the first mask having an opening exposing a first region of the semiconductor layer;

forming a second mask over the semiconductor layer, said second mask exposing said first region of the semiconductor layer, wherein all edges of said second mask surrounding said first region are pulled back from said opening in said first mask;

implanting a dopant of a second conductivity type through the opening in the first mask in the first region of the semiconductor layer to form a RESURF region;

then, removing said second mask;

growing a LOCOS field oxide region at a face of the first region defined by the opening of the first mask, the RESURF region being self-aligned with the LOCOS field oxide region;

forming a conductive gate over and insulated from a face of the semiconductor layer, the conductive gate extending over a portion of the LOCOS field oxide region;

forming a well of the first conductivity type in the semiconductor layer adjacent the RESURF region;

forming a source region of the second conductivity type in the well, the conductive gate extending over a channel region defined in the well between a first edge of the source region and a first edge of the RESURF region; and forming a drain region of the second conductivity type in the semiconductor layer directly adjacent a second edge of the RESURF region.

2. The method of claim 1, in which the step of forming a first mask includes:

depositing a layer of nitride over the semiconductor layer;

patterning and etching the layer of nitride to form the opening exposing the first region.

* * * * *